United States Patent
Xiao et al.

(10) Patent No.: US 10,152,922 B2
(45) Date of Patent: Dec. 11, 2018

(54) SCAN DRIVING CIRCUIT

(71) Applicants: SHENZHEN CHINA STAR OPTOELECTRONICS TECHNOLOGY CO., LTD., Shenzhen (CN); WUHAN CHINA STAR OPTOELECTRONICS TECHNOLOGY CO., LTD., Wuhan (CN)

(72) Inventors: Juncheng Xiao, Shenzhen (CN); Mang Zhao, Shenzhen (CN); Yong Tian, Shenzhen (CN)

(73) Assignee: SHENZHEN CHINA STAR OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/863,610

(22) PCT Filed: Aug. 10, 2015

(86) PCT No.: PCT/CN2015/086482
§ 371 (c)(1),
(2) Date: Sep. 24, 2015

(87) PCT Pub. No.: WO2017/020329
PCT Pub. Date: Feb. 9, 2017

(65) Prior Publication Data
US 2018/0190200 A1   Jul. 5, 2018

(30) Foreign Application Priority Data

Aug. 4, 2015   (CN) .......................... 2015 1 0469569

(51) Int. Cl.
G09G 3/3266   (2016.01)
G09G 3/36   (2006.01)
(Continued)

(52) U.S. Cl.
CPC ......... *G09G 3/3266* (2013.01); *G09G 3/3233* (2013.01); *G09G 3/36* (2013.01);
(Continued)

(58) Field of Classification Search
CPC ......... G09G 3/3266; G09G 2310/0267; G09G 2310/0286; G09G 2310/0264
See application file for complete search history.

(56) References Cited

U.S. PATENT DOCUMENTS

2005/0176194 A1   8/2005   Sasaki et al.
2011/0169843 A1   7/2011   Sasaki et al.
(Continued)

FOREIGN PATENT DOCUMENTS

CN         1649152 A      8/2005
CN       104064145 A      9/2014
(Continued)

*Primary Examiner* — Abbas Abdulselam
(74) *Attorney, Agent, or Firm* — Emerson, Thomson & Bennett, LLC; Roger D. Emerson (57) ABSTRACT

The present invention provides a scan driving circuit utilized to drive cascading scan lines. The scan driving circuit comprises a pull-down control module, a pull-down module, a reset control module, a reset module, a lower transmission module, a first bootstrap capacitor, a constant low voltage source, and a constant high voltage source. By use of the deployment of the reset module, the scan driving circuit of the present invention improves the stability of the scan driving circuit and meanwhile, the structure of the whole scan driving circuit is simplified.

18 Claims, 4 Drawing Sheets

(51) Int. Cl.
*G09G 3/3233* (2016.01)
*H01L 21/822* (2006.01)
*H01L 27/12* (2006.01)

(52) U.S. Cl.
CPC .......... *G09G 3/3674* (2013.01); *H01L 21/822* (2013.01); *H01L 27/1251* (2013.01)

(56) References Cited

U.S. PATENT DOCUMENTS

| | | | |
|---|---|---|---|
| 2013/0127809 A1* | 5/2013 | Han | G09G 3/20 345/211 |
| 2014/0062848 A1 | 3/2014 | Jinta | |
| 2015/0287364 A1* | 10/2015 | Chang | G09G 3/3258 345/77 |
| 2015/0364084 A1 | 12/2015 | Gu et al. | |
| 2016/0189648 A1 | 6/2016 | Xiao | |
| 2016/0267832 A1 | 9/2016 | Dai | |

FOREIGN PATENT DOCUMENTS

| | | |
|---|---|---|
| CN | 104078019 A | 10/2014 |
| CN | 104485079 A | 4/2015 |

\* cited by examiner

SCAN DRIVING CIRCUIT

BACKGROUND OF THE INVENTION

1. Field of the Invention

The present invention relates to a driving technology for a display, and more particularly, to a scan driving circuit.

2. Description of Prior Art

Gate Driver on Array, called GOA for short, is a technology of manufacturing a scan drive circuit on an array substrate of an existing TFT-LCD and carrying out progressive scanning for scan lines. The conventional scan driving circuit comprises a pull-up control module, a pull-module, a lower transmission module, a bootstrap capacitor, and a reset control module.

When the scan driving circuit is operated at a high temperature, time delay and electrical leakage may be easily occurred, thereby affecting the stability of the scan driving circuit.

Therefore, it is necessary to provide a scan driving circuit in order to solve the problems of the prior arts.

SUMMARY OF THE INVENTION

The objective of present invention is to provide a scan driving circuit with a simple structure and high stability, for solving the problems of complex in structure and low stability in conventional scan driving circuits.

To solve above problems, the technical schemes provided by the present invention are described below.

One of the embodiments of the present invention provides a scan driving circuit, which is utilized to drive cascading scan lines, the scan driving circuit comprising: a pull-down control module for receiving an upper-level scan signal and generating a scan level signal of low voltage level for a corresponding scan line according to the upper-level scan signal; a pull-down module for pulling down the scan signal of the corresponding scan line according to the scan level signal; a reset control module for receiving a lower-level clock signal and generating a rest signal for the corresponding scan line according to the lower-level clock signal; a reset module for pulling up the scan signal of the corresponding scan line according to the reset signal; a lower transmission module for generating and transmitting a present-level clock signal according to the scan signal of the corresponding scan line; a first bootstrap capacitor for generating a low voltage level or a high voltage level of the scan level signal of the corresponding scan line; a constant low voltage source for providing a low voltage level signal; and a constant high voltage source for providing a high voltage level signal; wherein the reset module comprises a sixth switch, a seventh switch, an eighth switch, a ninth switch, and a tenth switch; the sixth switch having a control terminal with the reset signal inputted, an input terminal with the reset signal inputted, and an output terminal connected to an output terminal of the ninth switch; the seventh switch having a control terminal with the upper-level scan signal inputted, an input terminal connected to the constant high voltage source, and an output terminal connected to the output terminal of the sixth switch; the eighth switch having a control terminal connected to the output terminal of the sixth switch, an input terminal connected to the constant high voltage source, and an output terminal connected to the pull-down module; the ninth switch having a control terminal connected to the pull-down module, and an input terminal with the constant high voltage source inputted; and the tenth switch having a control terminal connected to the output terminal of the sixth switch, an input terminal connected to the constant high voltage source, and an output terminal connected to an output terminal of the scan signal of the corresponding scan line; wherein the pull-down module comprises a fifth switch having an input terminal connected to pull-down control module, a control terminal with an upper-level clock signal inputted, and an output terminal connected to the output terminal of the eighth switch; the lower transmission module comprises an eleventh switch having a control terminal respectively connected to the reset module and the pull-down module, an input terminal connected to the output terminal of the tenth switch, and an output terminal outputting the present-level clock signal.

In the scan driving circuit of the present invention, the pull-down control module is further utilized for receiving a lower-level scan signal and generating the scan level signal of low voltage level for the corresponding scan line according to the lower-level scan signal; and the reset control module is utilized for receiving the upper-level clock signal and generating the rest signal for the corresponding scan line according to the upper-level clock signal.

In the scan driving circuit of the present invention, the pull-down control module comprises a first switch and a second switch; the first switch has a control terminal with a first scan signal inputted, an input terminal with the upper-level scan signal inputted, and an output terminal connected to the pull-down module; and the second switch has a control terminal with a second scan signal inputted, an input terminal with the lower-level scan signal inputted, and an output terminal connected to the pull-down module.

In the scan driving circuit of the present invention, the reset control module comprises a third switch and a fourth switch; the third switch has a control terminal with the first scan signal inputted, an input terminal with the lower-level clock signal inputted, and an output terminal connected to the output terminal of the sixth switch; and the fourth switch has a control terminal with the second scan signal inputted, an input terminal with the upper-level clock signal inputted, and an output terminal connected to the output terminal of the sixth switch.

In the scan driving circuit of the present invention, the reset module further comprises a twelfth switch having a control terminal connected to the constant low voltage source, an input terminal connected to the output terminal of the fifth switch, and an output terminal connected to the output terminal of the tenth switch via the first bootstrap capacitor.

In the scan driving circuit of the present invention, the reset module further comprises a second bootstrap capacitor, the second bootstrap capacitor has one terminal connected to the constant high voltage source, and the other terminal of the second bootstrap capacitor is connected to the output terminal of the sixth switch.

In the scan driving circuit of the present invention, the pull-down control module directly inputs the lower-level clock signal or the upper-level clock signal as the reset signal of the scan line.

In the scan driving circuit of the present invention, the scan driving circuit uses p-type metal-oxide-semiconductor transistors or n-type metal-oxide-semiconductor transistors to control the pull-down control module, the pull-down module, the reset control module, the reset module, and the lower transmission module.

One of the embodiments of the present invention further provides a scan driving circuit, which is utilized to drive cascading scan lines, the scan driving circuit comprising: a pull-down control module for receiving an upper-level scan signal and generating a scan level signal of low voltage level for a corresponding scan line according to the upper-level scan signal; a pull-down module for pulling down the scan signal of the corresponding scan line according to the scan level signal; a reset control module for receiving a lower-level clock signal and generating a rest signal for the corresponding scan line according to the lower-level clock signal; a reset module for pulling up the scan signal of the corresponding scan line according to the reset signal; a lower transmission module for generating and transmitting a present-level clock signal according to the scan signal of the corresponding scan line; a first bootstrap capacitor for generating a low voltage level or a high voltage level of the scan level signal of the corresponding scan line; a constant low voltage source for providing a low voltage level signal; and a constant high voltage source for providing a high voltage level signal; wherein the reset module comprises a sixth switch, a seventh switch, an eighth switch, a ninth switch, and a tenth switch; the sixth switch having a control terminal with the reset signal inputted, an input terminal with the reset signal inputted, and an output terminal connected to an output terminal of the ninth switch; the seventh switch having a control terminal with the upper-level scan signal inputted, an input terminal connected to the constant high voltage source, and an output terminal connected to the output terminal of the sixth switch; the eighth switch having a control terminal connected to the output terminal of the sixth switch, an input terminal connected to the constant high voltage source, and an output terminal connected to the pull-down module; the ninth switch having a control terminal connected to the pull-down module, and an input terminal with the constant high voltage source inputted; and the tenth switch having a control terminal connected to the output terminal of the sixth switch, an input terminal connected to the constant high voltage source, and an output terminal connected to an output terminal of the scan signal of the corresponding scan line.

In the scan driving circuit of the present invention, the pull-down control module is further utilized for receiving a lower-level scan signal and generating the scan level signal of low voltage level for the corresponding scan line according to the lower-level scan signal; and the reset control module is utilized for receiving the upper-level clock signal and generating the rest signal for the corresponding scan line according to the upper-level clock signal.

In the scan driving circuit of the present invention, the pull-down control module comprises a first switch and a second switch; the first switch has a control terminal with a first scan signal inputted, an input terminal with the upper-level scan signal inputted, and an output terminal connected to the pull-down module; and the second switch has a control terminal with a second scan signal inputted, an input terminal with the lower-level scan signal inputted, and an output terminal connected to the pull-down module.

In the scan driving circuit of the present invention, the reset control module comprises a third switch and a fourth switch; the third switch has a control terminal with the first scan signal inputted, an input terminal with the lower-level clock signal inputted, and an output terminal connected to the output terminal of the sixth switch; and the fourth switch has a control terminal with the second scan signal inputted, an input terminal with the upper-level clock signal inputted, and an output terminal connected to the output terminal of the sixth switch.

In the scan driving circuit of the present invention, the pull-down module comprises a fifth switch having an input terminal connected to pull-down control module, a control terminal with an upper-level clock signal inputted, and an output terminal connected to the output terminal of the eighth switch.

In the scan driving circuit of the present invention, the lower transmission module comprises an eleventh switch having a control terminal respectively connected to the reset module and the pull-down module, an input terminal connected to the output terminal of the tenth switch, and an output terminal outputting the present-level clock signal.

In the scan driving circuit of the present invention, the reset module further comprises a twelfth switch having a control terminal connected to the constant low voltage source, an input terminal connected to the output terminal of the fifth switch, and an output terminal connected to the output terminal of the tenth switch via the first bootstrap capacitor.

In the scan driving circuit of the present invention, the reset module further comprises a second bootstrap capacitor, the second bootstrap capacitor has one terminal connected to the constant high voltage source, and the other terminal of the second bootstrap capacitor is connected to the output terminal of the sixth switch.

In the scan driving circuit of the present invention, the pull-down control module directly inputs the lower-level clock signal or the upper-level clock signal as the reset signal of the scan line.

In the scan driving circuit of the present invention, the scan driving circuit uses p-type metal-oxide-semiconductor transistors or n-type metal-oxide-semiconductor transistors to control the pull-down control module, the pull-down module, the reset control module, the reset module, and the lower transmission module.

Compared to the conventional scan driving circuits, by use of the deployment of the reset module, the scan driving circuit of the present invention improves the stability of the scan driving circuit and meanwhile, the structure of the whole scan driving circuit is simplified, thereby solving the problems of complex in structure and low stability in conventional scan driving circuits.

BRIEF DESCRIPTION OF THE DRAWINGS

To make above content of the present invention more easily understood, it will be described in details by using preferred embodiments in conjunction with the appending drawings.

DETAILED DESCRIPTION OF THE PREFERRED EMBODIMENTS

The following descriptions for the respective embodiments are specific embodiments capable of being implemented for illustrations of the present invention with referring to appending figures. In describing the present invention, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present invention for ease of understanding, but are not intended to limit the present invention.

In the appending drawings, units with similar structures are indicated by the same reference numbers.

Figure 1:
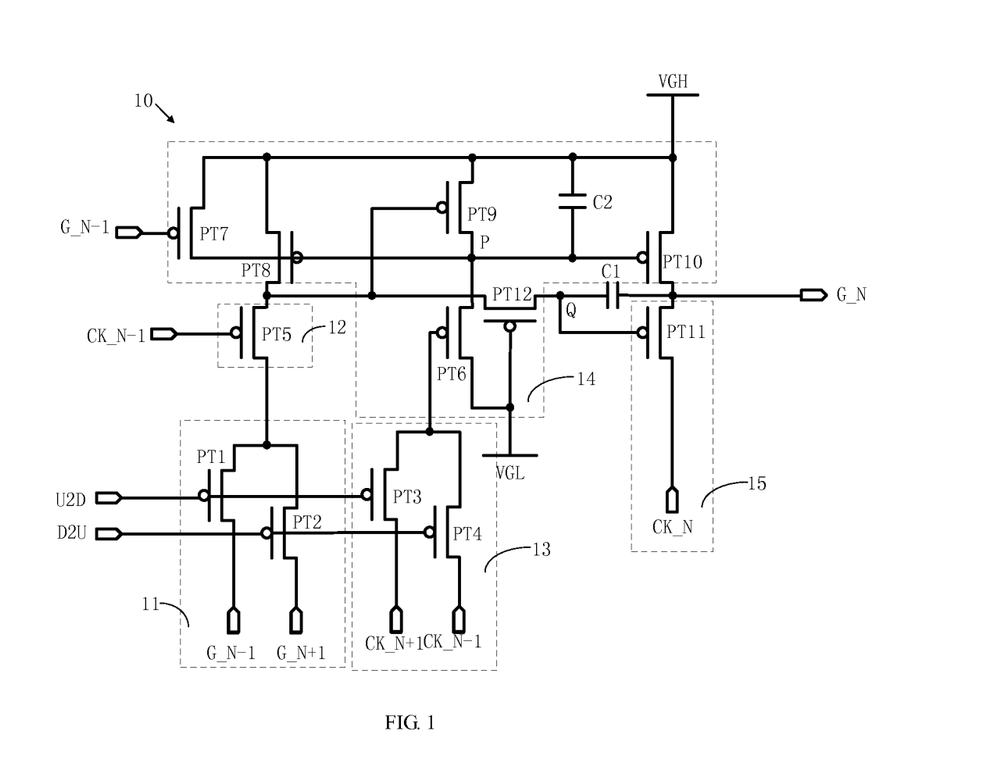
FIG. 1 is a schematic structural diagram showing a scan driving circuit in accordance with a first preferred embodiment of the present invention.

Please refer to FIG. 1, which is a schematic structural diagram showing a scan driving circuit in accordance with a first preferred embodiment of the present invention. The scan driving circuit of the present preferred embodiment is utilized to drive the cascading scan lines. The scan driving circuit 10 comprises a pull-down control module 11, a pull-down module 12, a reset control module 13, a reset module 14, a lower transmission module 15, a first bootstrap capacitor C1, a constant low voltage source VGL, and a constant high voltage source VGH.

The pull-down control module 11 is utilized for receiving an upper-level scan signal G_N−1 and generating a scan level signal of low voltage level for a corresponding scan line according to the upper-level scan signal G_N−1; or receiving a lower-level scan signal G_N+1 and generating a scan level signal of low voltage level for a corresponding scan line according to the lower-level scan signal G_N+1. The pull-down module 12 is utilized for pulling down a scan signal G_N of the corresponding scan line according to the scan level signal. The reset control module 13 is utilized for receiving a lower-level clock signal CK_N+1 and generating a rest signal for a corresponding scan line according to the lower-level clock signal CK_N+1; or receiving an upper-level clock signal CK_N−1 and generating a rest signal for a corresponding scan line according to the upper-level clock signal CK_N−1. The reset module 14 is utilized for pulling up the scan signal G_N of the corresponding scan line according to the reset signal. The lower transmission module 15 is utilized for generating and transmitting a present-level clock signal CK_N according to the scan signal G_N of a scan line. The first bootstrap capacitor C1 is utilized for generating a low voltage level or a high voltage level of the scan level signal of the scan line. The constant low voltage source VGL is used for providing a low voltage level signal. The constant high voltage source VGH is used for providing a high voltage level signal.

The pull-down control module 11 of the scan driving circuit 10 in accordance with the present preferred embodiment comprises a first switch PT1 and a second switch PT2. The first switch PT1 has a control terminal with a first scan signal U2D inputted, an input terminal with the upper-level scan signal G_N−1 inputted, and an output terminal connected to the pull-down module 12. The second switch PT2 has a control terminal with a second scan signal D2U inputted, an input terminal with the lower-level scan signal G_N+1 inputted, and an output terminal connected to the pull-down module 12.

The pull-down module 12 comprises a fifth switch PT5. The fifth switch PT5 has an input terminal connected to pull-down control module 11, a control terminal with the upper-level clock signal CK_N−1 inputted, and an output terminal connected to an output terminal of an eighth switch PT8 of the reset module 14.

The reset control module 13 comprises a third switch PT3 and a fourth switch PT4. The third switch PT3 has a control terminal with the first scan signal U2D inputted, an input terminal with the lower-level clock signal CK_N+1 inputted, and an output terminal connected to a control terminal of a sixth switch PT6 of the reset module 14 for outputting the reset signal. The fourth switch PT4 has a control terminal with the second scan signal D2U inputted, an input terminal with the upper-level clock signal CK_N−1 inputted, and an output terminal connected to the control terminal of the sixth switch PT6 of the reset module 14 for outputting the reset signal.

The reset module 14 comprises the sixth switch PT6, a seventh switch PT7, an eighth switch PT8, a ninth switch PT9, a tenth switch PT10, a twelfth switch PT12, and a bootstrap capacitor C2.

The sixth switch PT6 has the control terminal with the reset signal inputted, an input terminal with the constant low voltage source VGL inputted, and an output terminal connected to an output terminal of the ninth switch PT9.

The seventh switch PT7 has a control terminal with the upper-level scan signal inputted, an input terminal connected to the constant high voltage source VGH, and an output terminal connected to the output terminal of the sixth switch PT6.

The eighth switch PT8 has a control terminal connected to the output terminal of the sixth switch PT6, an input terminal connected to the constant high voltage source VGH, and an output terminal connected to the output terminal of the fifth switch PT5 of the pull-down module 15.

The ninth switch PT9 has a control terminal connected to the output terminal of the fifth switch PT5, and an input terminal with constant low voltage source VGL inputted.

The tenth switch PT10 has a control terminal connected to the output terminal of the sixth switch PT6, an input terminal connected to the constant high voltage source VGH, and an output terminal connected to an output terminal of the scan signal of the scan line.

The twelfth switch PT12 has a control terminal connected to the constant low voltage source VHL, an input terminal connected to the output terminal of the fifth switch PT5 of the pull-down module 12, and an output terminal outputting the present-level scan signal via the first bootstrap capacitor C1.

The bootstrap capacitor C2 has one terminal connected to the constant high voltage source VGH, and the other terminal of the bootstrap capacitor C2 is connected to the output terminal of the sixth switch PT6.

The tenth switch PT10 has a control terminal connected to the output terminal of the sixth switch PT6, an input terminal connected to the constant high voltage source VGH, and an output terminal connected to an output terminal of the scan signal of the scan line.

The clock signals of the scan driving circuit 10 in accordance with the present preferred embodiment are outputted by taking four signals as a cycle, that is, CK_N and CK_N+4 have the same waveform. At the beginning, the upper-level scan signal G_N−1 outputs a low voltage level signal, and at the same time, the first switch PT1 of the pull-down control module 11 is in a conducting state under the control of the scan signal U2D of low voltage level. Accordingly, the output terminal of the first switch PT1 outputs the upper-level scan signal G_N−1 to the input terminal of the fifth switch PT5 of the pull-down module 12. The voltage phases of the scan signal D2U and the scan signal U2D are inversed, and meanwhile, the second switch PT2 is in a non-conducting state under the control of the scan signal D2U of high voltage level.

Meanwhile, the control terminal of the fifth switch PT5 of the pull-down module 12 is inputted with the upper-level clock signal CK_N−1 of low voltage level. Accordingly, the fifth switch PT5 is in the conducting state and the output terminal of the fifth switch PT5 outputs the low voltage level signal G_N−1.

Meanwhile, the control terminal of the ninth switch PT9 of the reset module 14 receives the low voltage level signal G_N−1 outputted from the output terminal of the fifth switch PT5, and therefore the ninth switch PT9 is conducted. The control terminal of the eighth switch PT8 and the control terminal of the tenth switch PT10 are connected to the constant high voltage source VGH respectively via the ninth switch PT9, and therefore the eighth switch PT8 and the tenth switch PT10 are not conducted. Meanwhile, the deployment of the seventh switch PT7 can further assure the high voltage level at Point P at this time.

The twelfth switch PT12 of the reset module 14 is conducted under the control of the constant low voltage source VGL. The low voltage level signal G_N−1 outputted by the fifth switch PT5 of the pull-down module 12 acts on the first bootstrap capacitor C1 via the twelfth switch PT12 such that the voltage level of Point Q is much lower. In such a manner, G_N also outputs the low voltage level signal, and meanwhile the eleventh switch PT11 of the lower transmission module 15 is conducted under the control of the voltage level of Point Q, and the output terminal of the eleventh switch PT11 outputs the present-level clock signal CK_N of low voltage level to an upper-level scan line driving circuit.

When the lower-level clock signal CK_N+1 turns to the low voltage level, the third switch PT3 of the reset control module 13 outputs the lower-level clock signal CK_N+1 under the control of the first scan signal U2D. The output terminal of the third switch PT3 outputs the clock signal CK_N+1 (i.e., the reset signal) to the control terminal of the sixth switch PT6.

The sixth switch PT6 of the reset module 14 is conducted under the control of the reset signal. The constant low voltage source VGL is inputted into the control terminal of the eighth switch PT8 and the control terminal of the tenth switch PT10 via the sixth switch PT6. Meanwhile, the eighth switch PT8 and the tenth switch PT10 are conducted. The high voltage level signal of the constant high voltage source VGH is inputted to Point Q via the eighth switch PT8 and pulls up the voltage level at Point Q. Meanwhile, the high voltage level signal of the constant high voltage source VGH is inputted to G_N via the tenth switch PT10 and pulls up the voltage level of G_N. Meanwhile, the clock signal CK_N also turns to the high voltage level since the eleventh switch PT11 is not conducted.

In such a manner, the scan driving circuit 10 of the present preferred embodiment carries out the processes of cascading outputs.

Preferably, the deployment of a second bootstrap capacitor C2 in the reset module 14 can better pull up the voltage levels of the control terminal of the eighth switch PT8 and the control terminal of the tenth switch PT10, thereby assuring the low voltage level at Point Q to a greater degree.

Preferably, the reset control module 13 of the present preferred embodiment further comprises a fourth switch PT4, which has a control terminal with the second scan signal D2U inputted, an input terminal with the upper-level clock signal CK_N−1 inputted, and an output terminal outputting the reset signal of the scan line to the sixth switch PT6. In this way, the reset control module 13 can receive the upper-level clock signal CK_N−1 and generate the rest signal for a corresponding scan line according to the upper-level clock signal CK_N−1.

The scan driving circuit 10 of the present preferred embodiment can also carry out inverse scan by use of the second switch PT2 and the fourth switch PT4.

Preferably, the scan driving circuit 10 of the present preferred embodiment can use p-type metal-oxide-semiconductor transistors to control the pull-down control module 11, the pull-down module 12, the reset control module 13, the reset module 14, and the lower transmission module 15. Preferably, it can also use n-type metal-oxide-semiconductor transistors to control the pull-down control module 11, the pull-down module 12, the reset control module 13, the reset module 14, and the lower transmission module 15.

Figure 2:
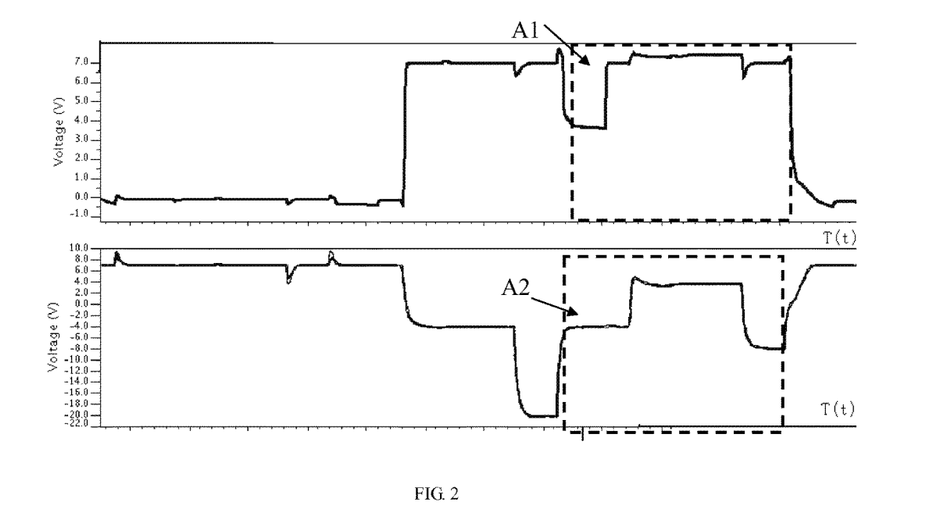
FIG. 2 is a voltage waveform diagram showing voltages at Point Q and Point P in the scan driving circuit shown in FIG. 1

Please refer to FIG. 2, which is a voltage waveform diagram showing voltages at Point Q and Point P in the scan driving circuit shown in FIG. 1, wherein the voltages at Point P in the scan driving circuit are shown at top side of FIG. 2, and the voltages at Point Q in the scan driving circuit are shown at bottom side of FIG. 2. Effectively pulling up the voltage level at Point Q can only be assured by pulling down the voltage level at Point P to a greater degree, thereby effectively resetting the G_N signal to a high voltage level. As shown in Area A1 of FIG. 2, due to the act of third switch PT3 and the fourth switch PT4, the gate driving voltage of the sixth switch PT6 suffers a threshold voltage drift, thereby reducing a pull-down current the sixth switch PT6 acts on Point P. Meanwhile, a pull-up current is resided at Point P due to the act of the ninth switch PT9, and therefore the voltage level at Point P cannot be pulled down effectively. As shown in Area A2 of FIG. 2, this results in unable to effectively reset or pull up the voltage level of Point Q. This may cause a malfunction of the entire scan driving circuit.

Figure 3:
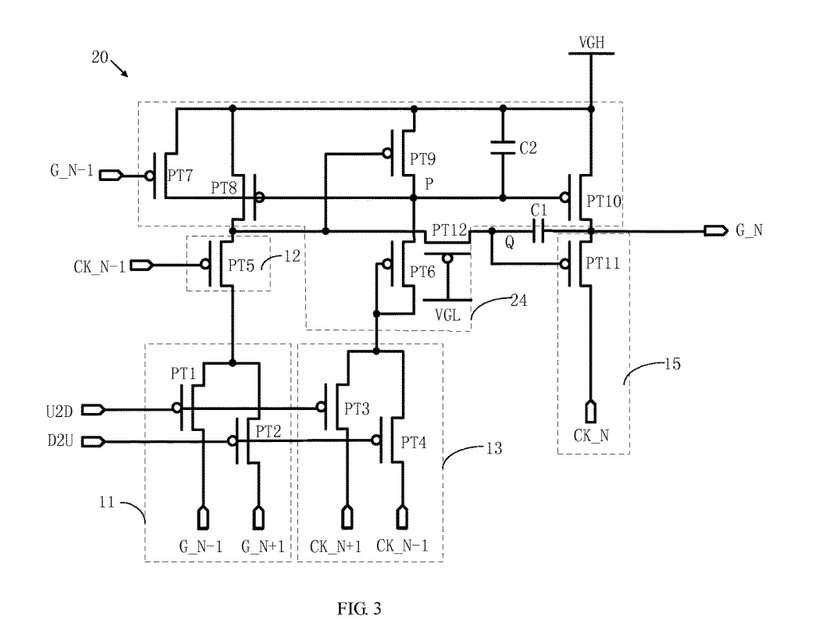
FIG. 3 is a schematic structural diagram showing a scan driving circuit in accordance with a second preferred embodiment of the present invention.
Figure 4:
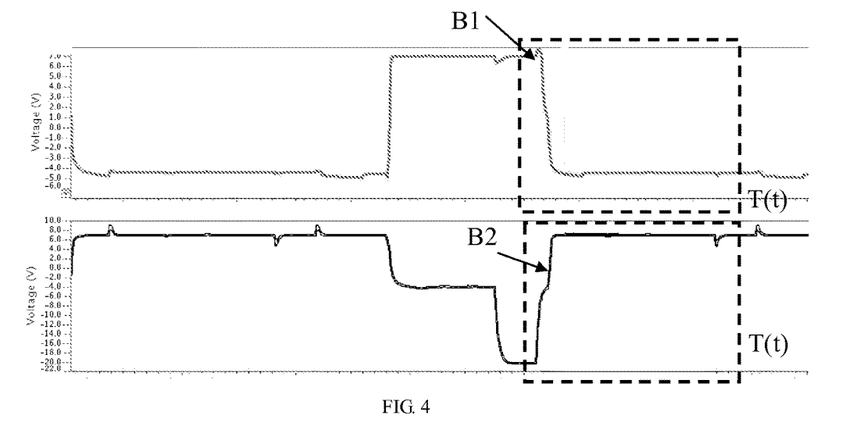
FIG. 4 is a voltage waveform diagram showing voltages at Point Q and Point P in the scan driving circuit shown in FIG. 3

Please refer to FIG. 3 and FIG. 4. FIG. 3 is a schematic structural diagram showing a scan driving circuit in accordance with a second preferred embodiment of the present invention. FIG. 4 is a voltage waveform diagram showing voltages at Point Q and Point P in the scan driving circuit shown in FIG. 3. On the basis of the first preferred embodiment, the control terminal of the sixth switch PT6 of the reset module 24 of a scan driving circuit 20 in accordance with the present preferred embodiment is inputted with the reset signal, the input terminal of the sixth switch PT6 is also inputted with the reset signal, and the output terminal of the sixth switch PT6 is connected to the output terminal of the ninth switch PT9.

This can better take away the effect on the gate driving voltage of the sixth switch PT6, caused by the direct current (DC) in the sixth switch PT6. Directly using the clock signal to pull down the voltage level at Point P increases the stability of the entire circuit and improves the noise limit of the entire scan driving circuit.

Please refer to FIG. 4. The voltages at Point P in the scan driving circuit are shown at top side of FIG. 4 and the voltages at Point Q in the scan driving circuit are shown at bottom side of FIG. 4. As can be seen from the drawings, e.g., Area B1 in FIG. 4, the voltage level at Point P can be effectively pulled down due to the connection deployment of the control terminal of the sixth switch PT6. Meanwhile, as shown in Area B2 of FIG. 4, the voltage level at Q point is also effectively pulled up. This carries out effectively resetting the G_N signal of high voltage level and avoids a malfunction of the scan driving circuit.

The working principles of positive-directional scanning performed by the scan driving circuit 20 of the present preferred embodiment is the same as or similar to that of the afore-described scan driving circuit 10 of the first preferred embodiment, and thus please refer to the related descriptions of the afore-describe scan driving circuit 10 of the first preferred embodiment.

Therefore, on the basis of the first preferred embodiment, the scan driving circuit of the present preferred embodiment can further improve the stability of the scan driving circuit.

Figure 5A:
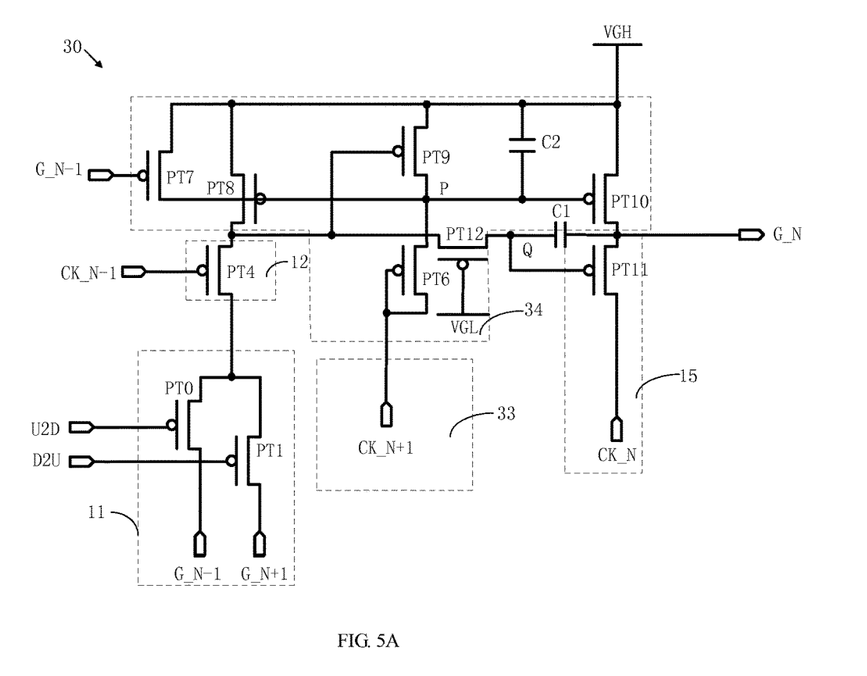
FIG. 5A is a schematic structural diagram showing a scan driving circuit performing positive-directional scanning in accordance with a third preferred embodiment of the present invention.

Please refer to FIG. 5A, which is a schematic structural diagram showing a scan driving circuit performing positive-directional scanning in accordance with a third preferred embodiment of the present invention. On the basis of the second preferred embodiment, the third switch and the fourth switch are removed from the reset control module 33 of the scan driving circuit 30 of the present preferred embodiment and the upper-level clock signal or the lower-level clock signal are taken as the reset signal, which is directly inputted to the control terminal of the sixth switch PT6 of the reset module 34.

This can better avoid the effect on the gate driving voltage of the sixth switch PT6, caused by the third switch and the fourth switch. The type of the reset signal and the way of cascading can be determined by a clock driving chip according to scanning sequence of the scan driving circuit such that the reset module 34 can effectively pull up the scan signal of a corresponding scan line.

When the scan driving circuit 30 of the present preferred embodiment performs the positive-directional scanning, the pull-down control module 11 receives the upper-level scan signal G_N−1 and generates a scan level signal of low voltage level for a corresponding scan line according to the upper-level scan signal G_N−1, and the reset module 34 receives the lower-level clock signal CK_N+1 and pulls up the scan signal G_N of a corresponding scan line according to the lower-level clock signal CK_N+1.

The working principles of the positive-directional scanning performed by the scan driving circuit 30 of the present preferred embodiment is the same as or similar to that of the afore-described scan driving circuit 20 of the second preferred embodiment, and thus please refer to the related descriptions of the afore-describe scan driving circuit 20 of the second preferred embodiment.

Figure 5B:
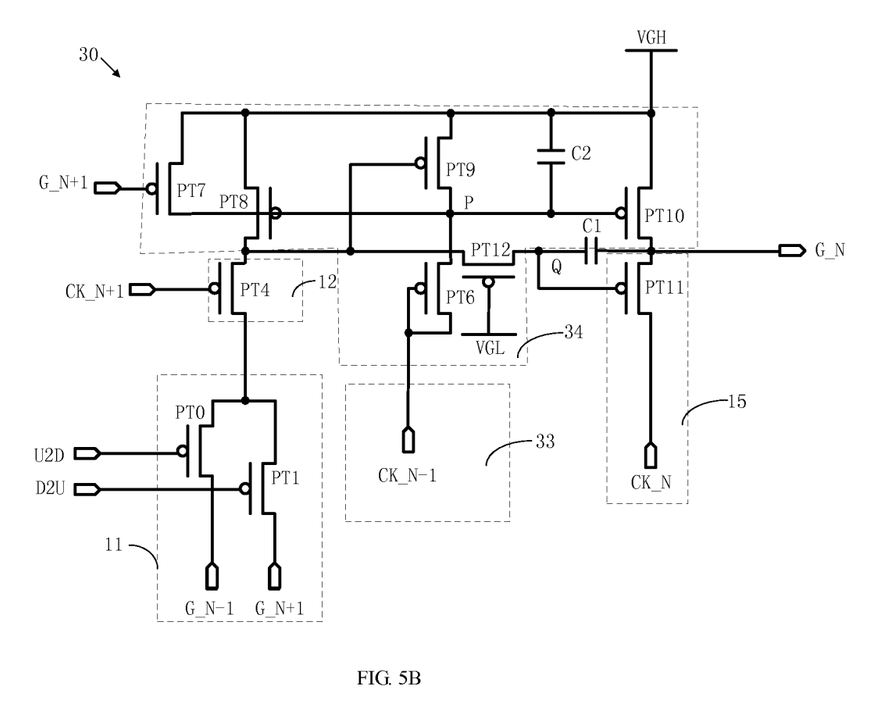
FIG. 5B is a schematic structural diagram showing a scan driving circuit performing negative-directional scanning in accordance with the third preferred embodiment of the present invention.

Please refer to FIG. 5B, which is a schematic structural diagram showing a scan driving circuit performing negative-directional scanning in accordance with the third preferred embodiment of the present invention. The differences between the negative-directional scanning and the positive-directional scanning are that as to the negative-directional scanning, the pull-down control module 11 receives the lower-level scan signal G_N+1 and generates a scan level signal of low voltage level for a corresponding scan line according to the lower-level scan signal G_N+1. The reset module 34 receives the upper-level clock signal CK_N−1 and pulls up the scan signal G_N of the corresponding scan line according to the upper-level clock signal CK_N−1.

The working principles of the negative-directional scanning performed by the scan driving circuit 30 of the present preferred embodiment is the same as or similar to that of the afore-described scan driving circuit 20 of the second preferred embodiment, and thus please refer to the related descriptions of the afore-describe scan driving circuit 20 of the second preferred embodiment.

By use of the deployment of the reset module, the scan driving circuit of the present invention improves the stability of the scan driving circuit and meanwhile, the structure of the whole scan driving circuit is simplified, thereby solving the problems of complex in structure and low stability in conventional scan driving circuits.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A scan driving circuit, which is utilized to drive cascading scan lines, the scan driving circuit comprising:

a pull-down control means for receiving an upper-level scan signal and generating a scan level signal of low voltage level for a corresponding scan line according to the upper-level scan signal;

a pull-down module for pulling down the scan signal of the corresponding scan line according to the scan level signal;

a reset control means for receiving a lower-level clock signal and generating a rest signal for the corresponding scan line according to the lower-level clock signal;

a reset module for pulling up the scan signal of the corresponding scan line according to the reset signal;

a lower transmission module for generating and transmitting a present-level clock signal according to the scan signal of the corresponding scan line;

a first bootstrap capacitor for generating a low voltage level or a high voltage level of the scan level signal of the corresponding scan line;

a constant low voltage source for providing a low voltage level signal; and a constant high voltage source for providing a high voltage level signal;

wherein the reset module comprises a sixth switch, a seventh switch, an eighth switch, a ninth switch, and a tenth switch;

the sixth switch having a control terminal with the reset signal inputted, an input terminal with the reset signal inputted, and an output terminal connected to an output terminal of the ninth switch;

the seventh switch having a control terminal with the upper-level scan signal inputted, an input terminal connected to the constant high voltage source, and an output terminal connected to the output terminal of the sixth switch;

the eighth switch having a control terminal connected to the output terminal of the sixth switch, an input terminal connected to the constant high voltage source, and an output terminal connected to the pull-down module;

the ninth switch having a control terminal connected to the pull-down module, and an input terminal with the constant high voltage source inputted;

the tenth switch having a control terminal connected to the output terminal of the sixth switch, an input terminal connected to the constant high voltage source, and an output terminal connected to an output terminal of the scan signal of the corresponding scan line;

wherein the pull-down module comprises a fifth switch having an input terminal connected to pull-down control means, a control terminal with an upper-level clock signal inputted, and an output terminal connected to the output terminal of the eighth switch; the lower transmission module comprises an eleventh switch having a control terminal respectively connected to the reset module and the pull-down module, an input terminal connected to the output terminal of the tenth switch, and an output terminal outputting the present-level clock signal.

2. The scan driving circuit according to claim 1, wherein the pull-down control means is further utilized for receiving a lower-level scan signal and generating the scan level signal of low voltage level for the corresponding scan line according to the lower-level scan signal; and the reset control means is utilized for receiving the upper-level clock signal and generating the rest signal for the corresponding scan line according to the upper-level clock signal.

3. The scan driving circuit according to claim 2, wherein the pull-down control means comprises a first switch and a second switch;

the first switch has a control terminal with a first scan signal inputted, an input terminal with the upper-level scan signal inputted, and an output terminal connected to the pull-down module; and the second switch has a control terminal with a second scan signal inputted, an input terminal with the lower-level scan signal inputted, and an output terminal connected to the pull-down module.

4. The scan driving circuit according to claim 2, wherein the reset control means comprises a third switch and a fourth switch;

the third switch has a control terminal with the first scan signal inputted, an input terminal with the lower-level clock signal inputted, and an output terminal connected to the output terminal of the sixth switch; and the fourth switch has a control terminal with the second scan signal inputted, an input terminal with the upper-level clock signal inputted, and an output terminal connected to the output terminal of the sixth switch.

5. The scan driving circuit according to claim 1, wherein the reset module further comprises a twelfth switch having a control terminal connected to the constant low voltage source, an input terminal connected to the output terminal of the fifth switch, and an output terminal connected to the output terminal of the tenth switch via the first bootstrap capacitor.

6. The scan driving circuit according to claim 1, wherein the reset module further comprises a second bootstrap capacitor, the second bootstrap capacitor has one terminal connected to the constant high voltage source, and the other terminal of the second bootstrap capacitor is connected to the output terminal of the sixth switch.

7. The scan driving circuit according to claim 1, wherein the pull-down control means directly inputs the lower-level clock signal or the upper-level clock signal as the reset signal of the scan line.

8. The scan driving circuit according to claim 1, wherein the scan driving circuit uses p-type metal-oxide-semiconductor transistors or n-type metal-oxide-semiconductor transistors to control the pull-down control means, the pull-down module, the reset control means, the reset module, and the lower transmission module.

9. The scan driving circuit according to claim 8, wherein the reset module further comprises a second bootstrap capacitor, the second bootstrap capacitor has one terminal connected to the constant high voltage source, and the other terminal of the second bootstrap capacitor is connected to the output terminal of the sixth switch.

10. A scan driving circuit, which is utilized to drive cascading scan lines, the scan driving circuit comprising:

a pull-down control means for receiving an upper-level scan signal and generating a scan level signal of low voltage level for a corresponding scan line according to the upper-level scan signal;

a pull-down means for pulling down the scan signal of the corresponding scan line according to the scan level signal;

a reset control means for receiving a lower-level clock signal and generating a rest signal for the corresponding scan line according to the lower-level clock signal;

a reset module for pulling up the scan signal of the corresponding scan line according to the reset signal;

a lower transmission means for generating and transmitting a present-level clock signal according to the scan signal of the corresponding scan line;

a first bootstrap capacitor for generating a low voltage level or a high voltage level of the scan level signal of the corresponding scan line;

a constant low voltage source for providing a low voltage level signal; and a constant high voltage source for providing a high voltage level signal;

wherein the reset module comprises a sixth switch, a seventh switch, an eighth switch, a ninth switch, and a tenth switch;

the sixth switch having a control terminal with the reset signal inputted, an input terminal with the reset signal inputted, and an output terminal connected to an output terminal of the ninth switch;

the seventh switch having a control terminal with the upper-level scan signal inputted, an input terminal connected to the constant high voltage source, and an output terminal connected to the output terminal of the sixth switch;

the eighth switch having a control terminal connected to the output terminal of the sixth switch, an input terminal connected to the constant high voltage source, and an output terminal connected to the pull-down means;

the ninth switch having a control terminal connected to the pull-down means, and an input terminal with the constant high voltage source inputted; and the tenth switch having a control terminal connected to the output terminal of the sixth switch, an input terminal connected to the constant high voltage source, and an output terminal connected to an output terminal of the scan signal of the corresponding scan line.

11. The scan driving circuit according to claim 10, wherein the pull-down control means is further utilized for receiving a lower-level scan signal and generating the scan level signal of low voltage level for the corresponding scan line according to the lower-level scan signal; and the reset control means is utilized for receiving the upper-level clock signal and generating the rest signal for the corresponding scan line according to the upper-level clock signal.

12. The scan driving circuit according to claim 11, wherein the pull-down control means comprises a first switch and a second switch;

the first switch has a control terminal with a first scan signal inputted, an input terminal with the upper-level scan signal inputted, and an output terminal connected to the pull-down means; and the second switch has a control terminal with a second scan signal inputted, an input terminal with the lower-level scan signal inputted, and an output terminal connected to the pull-down means.

13. The scan driving circuit according to claim 11, wherein the reset control means comprises a third switch and a fourth switch;

the third switch has a control terminal with the first scan signal inputted, an input terminal with the lower-level clock signal inputted, and an output terminal connected to the output terminal of the sixth switch; and the fourth switch has a control terminal with the second scan signal inputted, an input terminal with the upper-level clock signal inputted, and an output terminal connected to the output terminal of the sixth switch.

14. The scan driving circuit according to claim 10, wherein the pull-down means comprises a fifth switch having an input terminal connected to pull-down control means, a control terminal with an upper-level clock signal inputted, and an output terminal connected to the output terminal of the eighth switch.

15. The scan driving circuit according to claim 10, wherein the lower transmission means comprises an eleventh switch having a control terminal respectively connected to the reset module and the pull-down means, an input terminal connected to the output terminal of the tenth switch, and an output terminal outputting the present-level clock signal.

16. The scan driving circuit according to claim 10, wherein the reset module further comprises a twelfth switch having a control terminal connected to the constant low voltage source, an input terminal connected to the output terminal of the fifth switch, and an output terminal connected to the output terminal of the tenth switch via the first bootstrap capacitor.

17. The scan driving circuit according to claim 10, wherein the pull-down control means directly inputs the lower-level clock signal or the upper-level clock signal as the reset signal of the scan line.

18. The scan driving circuit according to claim 10, wherein the scan driving circuit uses p-type metal-oxide-semiconductor transistors or n-type metal-oxide-semiconductor transistors to control the pull-down control means, the pull-down means, the reset control means, the reset module, and the lower transmission means.

* * * * *

UNITED STATES PATENT AND TRADEMARK OFFICE
CERTIFICATE OF CORRECTION

PATENT NO. : 10,152,922 B2  
APPLICATION NO. : 14/863610  
DATED : December 11, 2018  
INVENTOR(S) : Junchen Xiao, Mang Zhao and Yong Tian

Page 1 of 1

It is certified that error appears in the above-identified patent and that said Letters Patent is hereby corrected as shown below:

On the Title Page

Item (73) Assignee add "Wuhan China Star Optoelectronics Technology Co., Ltd. (CN)"

Signed and Sealed this  
Nineteenth Day of November, 2019

Andrei Iancu  
*Director of the United States Patent and Trademark Office*